United States Patent [19]
Morikawa

[11] Patent Number: 5,942,789
[45] Date of Patent: Aug. 24, 1999

[54] PHOTODETECTOR AND METHOD FOR FABRICATING SAME

[75] Inventor: Takenori Morikawa, Tokyo, Japan

[73] Assignee: NEC Corporation, Tokyo, Japan

[21] Appl. No.: 08/902,283

[22] Filed: Jul. 29, 1997

[30] Foreign Application Priority Data

Jul. 30, 1996 [JP] Japan ................................ 8-200636

[51] Int. Cl.⁶ .................................................. H01L 31/00
[52] U.S. Cl. .......................... 257/459; 257/461; 257/463
[58] Field of Search .................................. 257/459, 461, 257/463, 465, 452, 462; 438/69, 74, 77, 92

[56] References Cited

U.S. PATENT DOCUMENTS

| | | | |
|---|---|---|---|
| 5,130,776 | 7/1992 | Popovic et al. ........................... | 257/461 |
| 5,187,554 | 2/1993 | Miwa ........................................ | 307/586 |
| 5,466,962 | 11/1995 | Yamamoto et al. ..................... | 257/437 |
| 5,600,173 | 2/1997 | Suzunaga ................................. | 257/446 |

FOREIGN PATENT DOCUMENTS 4-114469  4/1992  Japan .

OTHER PUBLICATIONS

By M. Sugiyama et al., "A selective epitaxial SiGe/Si planar photodetector for Si–based OEICs", *1995 IEEE,* IEOM pp. 583–586.

*Primary Examiner*—Jerome Jackson, Jr.
*Assistant Examiner*—George C. Eckert, II
*Attorney, Agent, or Firm*—Young & Thompson

[57] ABSTRACT

A photodetector provides high photo-sensitivity, a low resistance of a cathode circuit and quick photoresponse, and includes a light absorption layer in a cavity, which is formed in a N-Si epitaxial layer and surrounded by a side wall oxide layer. A N-Si diffusion layer is formed on the bottom and the side wall around the cavity and has a lower resistance than the epitaxial layer. The diffusion layer contacts a cathode take-out region so that the resistance of the cathode circuit is decreased.

15 Claims, 7 Drawing Sheets

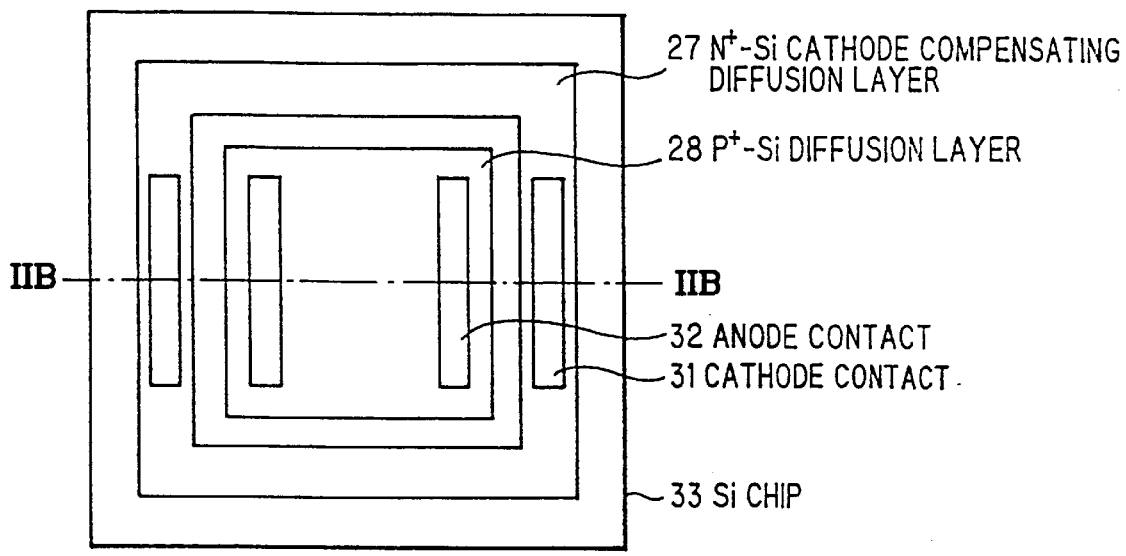
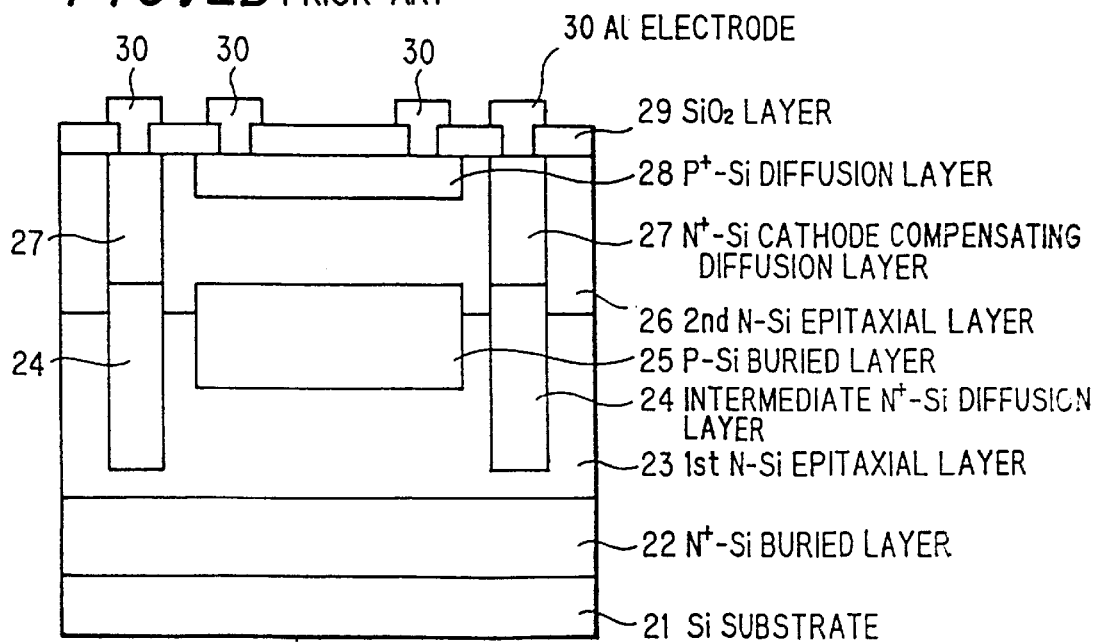

- 4 N-Si CATHODE TAKE-OUT REGION
- 3 N-Si EPITAXIAL LAYER
- 2 N⁺-Si BURIED LAYER
- 1 Si SUBSTRATE

- 15 SiO₂ APPLICATION LAYER
- 13 SiO₂ LAYER
- 14 PHOTODECTOR CAVITY
- 4 N-Si CATHODE TAKE-OUT REGION
- 5 N-Si DIFFUSION LAYER
- 3 N-Si EPITAXIAL LAYER
- 2 N⁺-Si BURIED LAYER
- 1 Si SUBSTRATE

PHOTODETECTOR AND METHOD FOR FABRICATING SAME

FIELD OF THE INVENTION

This invention relates to a photodetector and a method for fabricating the same, and especially to a photodetector fabricated in a planar structure on a silicon substrate and a method for fabricating the same.

BACKGROUND OF THE INVENTION

In optical communication systems, photodetectors based on compound semiconductors, such as InGaAsP, etc. are widely used. However, a photodetector comprising a light absorption layer of a Si/SiGe superlattice layer is preferred for the chemical compound based photodetector in view of its consistency with Si processing. A Si-based opt-electronic integrated circuit, on which Si-transistors and Si-based photodetectors are simultaneously integrated, is now being developed.

The structure of the photodiodes is roughly classified in two types, one is a surface incidence type and the other is a waveguide type. In the photodetector of the surface incidence type, the direction of the incident light is perpendicular to the surface of the substrate, while in the photodetector of the waveguide type, the direction of the incident light is parallel with the surface of the substrate. In the photodetectors of both types, photo-sensitivities can be increased by increasing the depth of the light absorption layer. In the photodetector of the surface incidence type, since the light incident path of the light can be increased, as the thickness of the light absorption layer is increased, the light reaches a deeper portion of the light absorption layer and the absorbed light increases, hence, the photo-sensitivity of the photodiode increases. On the other hand, in the photodetector of the waveguide type, received light power of the photodetector increases, as its receiving cross-sectional area for the incident light, which is emitted from the output end of an optical fiber, becomes larger, and subsequently the photo-sensitivity of the photodetector increases.

The greater part of the photodetectors used at present are of the surface incidence type. The common feature of the photodetectors of surface incidence type is that a light absorption layer is formed in a semiconductor epitaxial layer, and an end region of the light absorption layer is communicated with the cathode electrode of the photodetector via a part of the epitaxial layer, which runs in parallel with the side wall of the light absorption layer. If the depth of the light absorption layer is increased in order to increase a photo-sensitivity, a distance from the cathode electrode to the end region of the light absorption layer inevitably increases. Since the conductivity of the epitaxial layer is low in most cases for several reasons mentioned later, a resistance between the cathode electrode and the end region of the light absorption layer increases in the aforementioned case, which is unfavorable from the aspect of quick photoresponse of the photodetector. Thus, there is a trade-off between response and sensitivity. Some efforts have been made for decreasing the aforementioned cathode circuit resistance, but the structure of the photodetector becomes complicated and the time required for fabrication process increases.

SUMMARY OF THE INVENTION

Accordingly, it is an object of the invention to provide a photodetector, in which a depth of a light absorption layer is increased in order to obtain high photo-sensitivity, a resistance of a cathode circuit is low in spite of the increased depth of the light absorption layer, quick photoresponse can be achieved, productivity is improved and a degree of freedom in design is increased.

It is a further object of the invention to provide a method for fabricating a photodetector, in which a depth of a light absorption layer is increased in order to obtain high photo-sensitivity, a resistance of a cathode circuit is low in spite of the increased depth of the light absorption layer, quick photoresponse can be achieved, productivity is improved and a degree of freedom in design is increased, by forming a semiconductor diffusion layer by ion implantation.

It is a still further object of the invention to provide a method for fabricating a photodetector, in which a depth of a light absorption layer is increased in order to obtain high photo-sensitivity, a resistance of a cathode circuit is low in spite of the increased depth of the light absorption layer, quick photoresponse can be achieved, productivity is improved and a degree of freedom in design is increased, by forming a semiconductor diffusion layer by deoxidization of oxide application layer.

According to the first feature of the invention, a photodetector comprises:
  a cavity formed in the epitaxial layer and surrounded by a side wall oxide layer,
  a light absorption layer and a contact layer of a first conductivity type, both being successively grown in parallel with the epitaxial layer inside the cavity,
  a first diffusion layer of a second conductivity type formed on a bottom of the cavity,
  a second diffusion layer of a second conductivity type surrounding the side wall oxide layer and extending from a top surface of the epitaxial layer to the first diffusion layer, and
  a take-out region of a second conductivity type with high impurity concentration electrically connected with whole or a part of the second diffusion layer.

In this invention, Si is used as the material of the substrate in most cases, and the N-Si diffusion layer is insulated from the light absorption layer by a side wall oxide layer. The N-Si diffusion layer is continuously formed on the side wall of the cavity, ranging from the top surface of a processed substrate to the bottom of the cavity, and electrically connected to the cathode take-out region formed on the top surface. It is desirable that the impurity concentration of the N-Si diffusion layer is larger than $10^{17}$ cm$^{-3}$.

According to the second feature of the invention, a method for fabricating a photodetector comprises steps of:
  forming a buried layer of a second conductivity type with high impurity concentration on a semiconductor substrate of a first conductivity type,
  growing an epitaxial layer of a second conductivity type on the buried layer,
  forming a take-out region on the epitaxial layer by ion implantation,
  forming a cavity on the epitaxial layer by etching,
  forming first and second diffusion layers on an inner surface of the cavity by oblique ion implantation and subsequent thermal treatment,
  forming an insulator layer over a side wall of the cavity,
  selectively growing a light absorption layer and a contact layer of a first conductivity type inside of the cavity,
  forming an insulator layer on a top surface of a processed substrate, forming holes for accessing to cathode and anode contacts, and forming electrodes to be fitted in the holes.

According to the third feature of the invention, a method for fabricating a photodetector comprises steps of:

forming a buried layer of a second conductivity type with high impurity concentration on a semiconductor substrate of a first conductivity type, growing an epitaxial layer of a second conductivity type on the buried layer, forming a take-out region on the epitaxial layer by ion implantation, forming a cavity on the epitaxial layer by etching, applying an application layer containing arsenite to an inner surface of the cavity and forming first and second diffusion layers thereon by subsequent thermal treatment, forming an insulator layer on a side wall of the cavity, selectively growing a light absorption layer and a contact layer of a first conductivity type inside of the cavity, selectively growing a light absorption layer and a contact layer of a first conductivity type inside of the cavity, forming an insulator layer on a top surface of a processed substrate, making holes for accessing to cathode and anode contacts, and forming electrodes to be fitted in the holes.

In the two aforementioned inventions for the methods for fabricating a photodetector, Si is used as the material of the substrate in most cases. In the photodetector fabricated by these method, since the N-Si diffusion layer is formed on the bottom and around the side wall of the cavity formed in the N-Si epitaxial layer, the resistance of a cathode circuit can be decreased as compared with that of the conventional photodiode, in which the cathode circuit is formed through the N-Si epitaxial layer. Moreover, since the N-Si diffusion layer is formed in self-alignment by ion implantation or diffusion, after the cavity is formed in the N-Si epitaxial layer, no patterning is necessary for forming the N-Si diffusion layer. Besides, an intermediate N⁺-Si diffusion is unnecessary in the N-Si epitaxial and the process of fabrication is thereby simplified. The degree of freedom in design is increased, because the design can be carried out without being concerned with the depth of the cavity.

BRIEF DESCRIPTION OF THE DRAWINGS

The invention will be explained in more detail in conjunction with the appended drawings, wherein.

DESCRIPTION OF THE PREFERRED EMBODIMENTS

Before explaining a photodetector in the preferred embodiments according to the invention, the aforementioned conventional photodetectors will be explained.

Figure 1A:
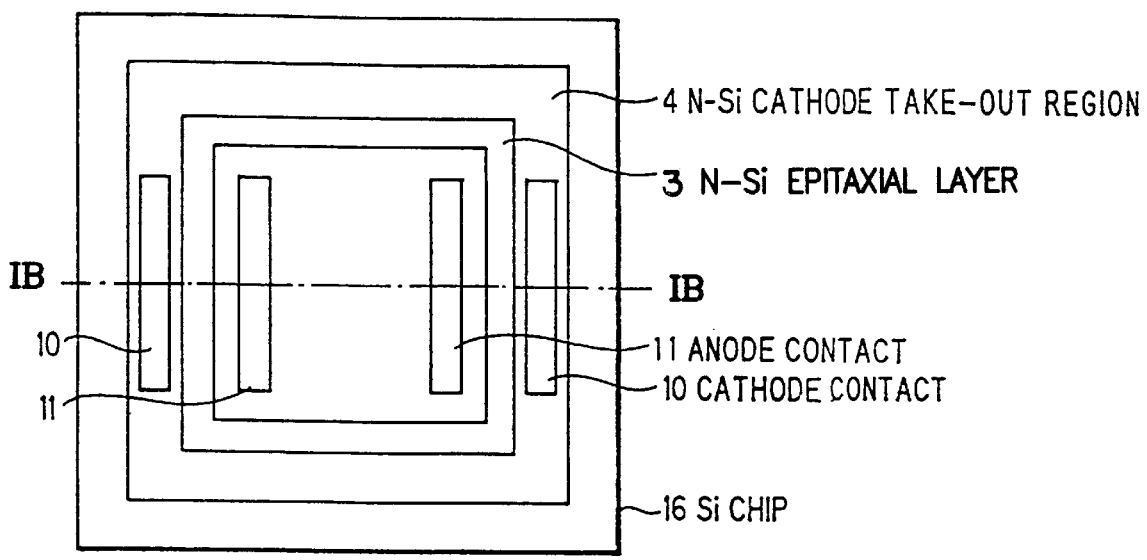
FIGS. 1A and 1B respectively show planar and cross-sectional views for representing the structure of a conventional photodetector, FIGS. 2A and 2B respectively show planar and cross-sectional views for representing the structure of another conventional photodetector, FIGS. 3A and 3B respectively show planar and cross-sectional views for representing the structure of a photodetector, as the first preferred embodiment of the invention.
Figure 1B:
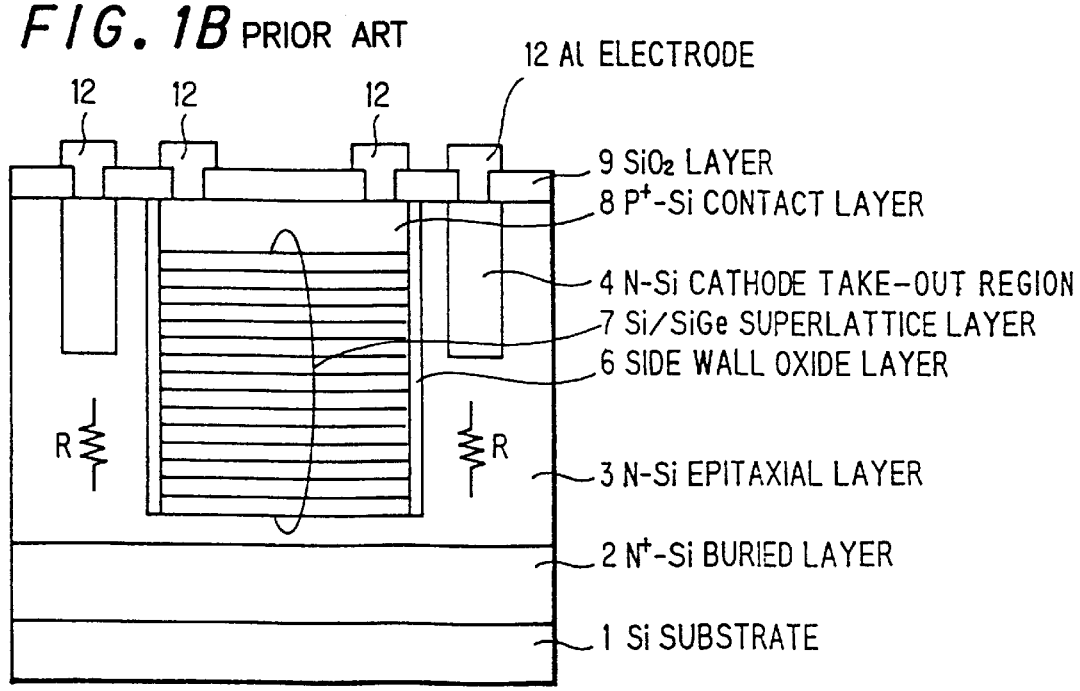

For example, a report on a photodetector employing a Si/SiGe superlattice layer as an absorption layer is shown on IEDM Tech. Dig. Pages 583–586, 1995. FIGS. 1A and 1B are respectively planar and cross-sectional views of the photodetector shown in the aforementioned report. In this photodiode, a N-Si epitaxial layer 3 is grown on a Si substrate 1 via a N⁺ buried layer 2, and a N-Si cathode take-out region 4 is formed on the surface of the N-Si epitaxial layer 3 by P ion implantation. On a region, where a light absorption layer is to be formed, a cavity is made by etching the N-Si epitaxial layer 3, an oxide layer is formed on an inner surface of the cavity, and a side wall oxide layer 6 is formed by means of etching back. After a Si/SiGe superlattice layer 7 and a P⁺-Si contact layer 8 are successively and selectively grown in the cavity, contact holes are made on a $SiO_2$ layer 9 covering the top surface of the processed substrate, and Al electrodes 12 to be fitted in the aforementioned contact holes are formed. In case that the depth of the N-Si epitaxial layer 3 is large in this structure, a resistance of the cathode circuit is considerably influenced by the resistivity of the N-Si epitaxial layer 3 and its thickness.

FIGS. 2A and 2B respectively show planar and cross-sectional views of another photodetector of the surface incidence type disclosed in Japanese Patent Kokai No. 4-114469, in which the depth of the light absorption layer is large. In this device, the first epitaxial layer 23 is grown on a P-Si substrate 21 via a N⁺-Si buried layer 22, a N⁺-Si intermediate diffusion layer 24 is formed in the first epitaxial layer 23, the second N-Si epitaxial layer 26 is grown on the surface of the first N-Si epitaxial layer 23, and a N⁺-Si compensating layer 27 and a P⁺-Si diffusion layer 28 are formed. A diode is thus obtained. Moreover, in this photodetector, the extension of a depletion layer is promoted by forming a P-Si buried layer 25 and thereby the photosensitivity of the photodetector can be improved. However, if the depth of the light absorption layer is increased, the distance from the N⁺-Si buried layer 22 to the N⁺ cathode compensating layer 27 is prolonged and a series resistance of the cathode circuit increases, hence, the photoresponse of the photodetector is deteriorated.

Accordingly, in the conventional photodetector shown in FIGS. 2A and 2B, the intermediate N⁺-Si diffusion layer 24 is formed after the first N-Si epitaxial layer 23 is grown. Moreover, the N⁺-Si cathode compensating layer 27 and the collector take-out region of a bipolar transistor integrated on the same substrate are simultaneously formed, and thereby the resistance of the cathode circuit can be sufficiently decreased.

The first problem of the conventional photodetector is that, when the depth of the light absorption layer is increased, the resistance of the cathode circuit increases on account of the increased depth of the epitaxial layer with low impurity concentration, hence, quick photoresponse cannot be achieved. The reason is that the epitaxial layer with high impurity concentration cannot be used in order to extend a depletion layer and it is difficult to grow an epitaxial layer with high impurity concentration due to problems related to crystallization of Si.

The second problem of the conventional photodetector is that, the time required for fabricating the photodetector is long and productivity is low, because two successive epitaxial growths are necessary in order to simultaneously grow a layer of a bipolar transistor integrated on the same substrate. The corresponding epitaxial layer cannot be larger than 1 μm in order to prevent the deterioration of the quick response of the bipolar transistor.

Figure 3A:
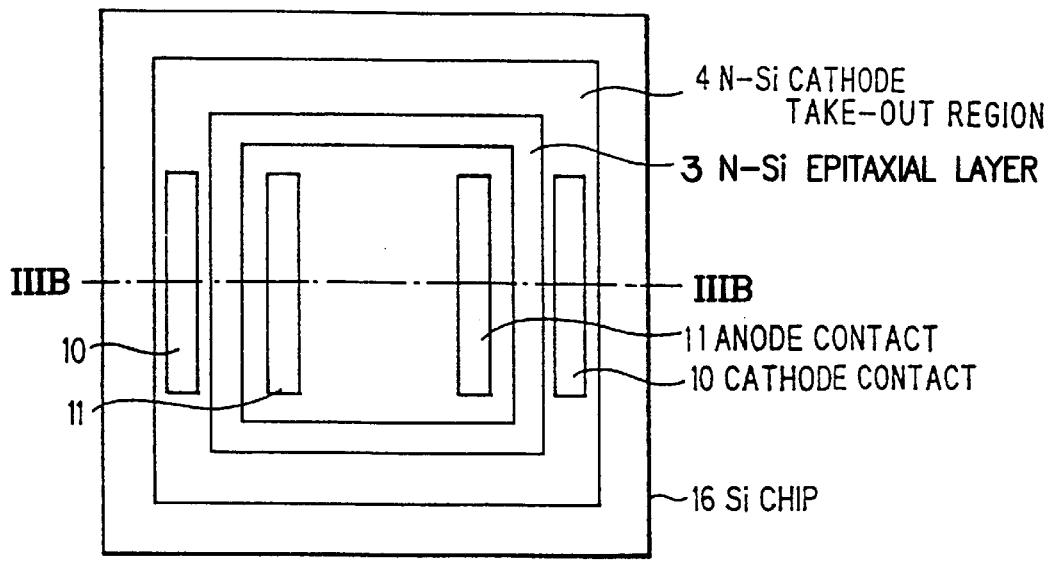
Figure 3B:
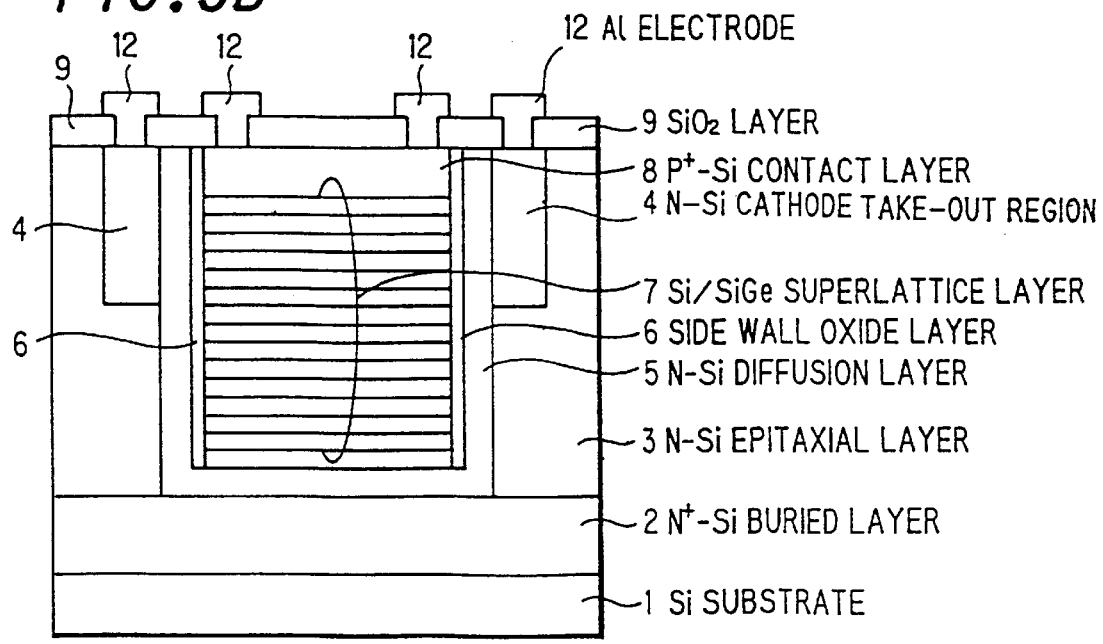

Next, the embodiments of the invention will be explained referring to the appended drawings. FIG. 3A is a planar view of a photodetector according to the first preferred embodiment of the invention, and FIG. 3B is a cross-sectional view of the aforementioned photodetector in cross-section shown in FIG. 3A. Al electrodes 12 for taking-out anode and cathode contacts are omitted in FIG. 3A. This photodetector is of the surface-incidence-type for detecting a light incident upon the surface of a Si substrate and fabricated in a Si chip 16 as a planar structure.

In the photodetector shown in FIG. 3A to 3B, a $N^+$-Si buried layer 2 and a Ni-Si epitaxial layer 3 are successively grown on a Si substrate 1, and a photodetector cavity surrounded by a side wall oxide layer 6 with a rectangular cross-section is formed thereon. All around the bottom and the side wall of the photodetector cavity, a N-Si diffusion layer 5 is formed. Moreover, a Si/SiGe superlattice layer 7 and a $P^+$-Si contact layer 8 are successively grown on the bottom surface of the photodetector cavity and fill up the interior region thereof. In addition in the outside region of the photodetector cavity, a cathode take-out region 4 adjacent to the N-Si diffusion layer 5 is formed. On the surface of a Si chip 16, a $SiO_2$ layer 9 serving as a protecting layer is formed. Moreover, the Al electrodes 12 of the photodetector are formed on the $SiO_2$ layer 9 via cathode contacts 10 and anode contacts 11.

Figure 4A:
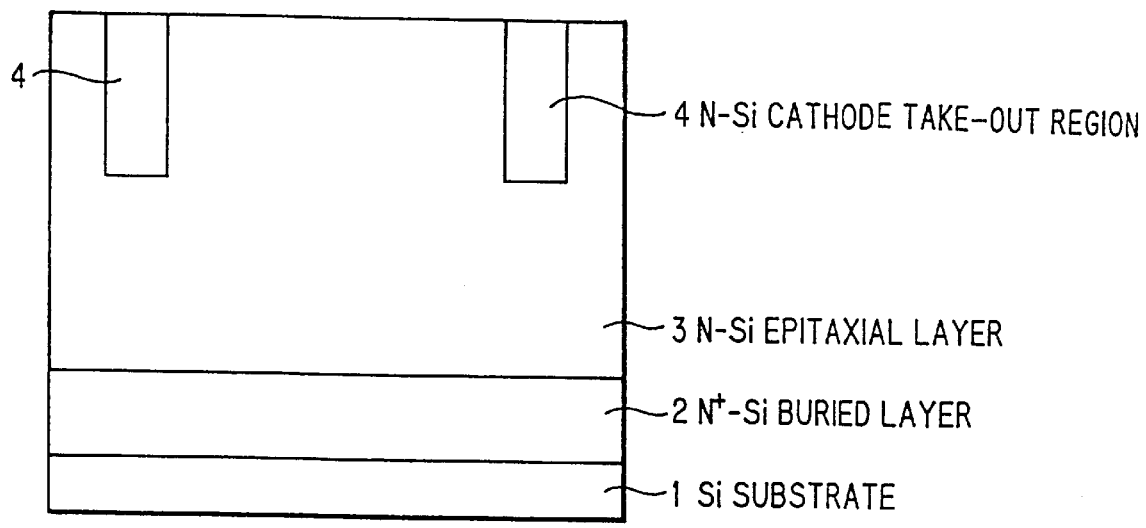
FIGS. 4A and 4B are respectively cross-sectional views for explaining a fabrication process of the photodetector shown in FIGS. 3A and 3B, as the second preferred embodiment of the invention.

Next, the fabrication process of the photodetector will be explained referring to the appended drawings, as the second preferred embodiment of the invention. First, as shown in FIG. 4A, a $N^+$-Si buried layer 2 is formed on a Si substrate 1, and a N-Si epitaxial layer 3 is grown thereon, the thickness of which is about 3 to 5 μm for example. Next, P ions are implanted on the N-Si epitaxial layer 3 using a photo-resist (not shown) as a mask, and a thermal treatment is carried out at 1000° C. for 30 minutes in the atmosphere of $N_2$ for example, and a cathode take-out region 4 is formed at a desired position.

Figure 4B:
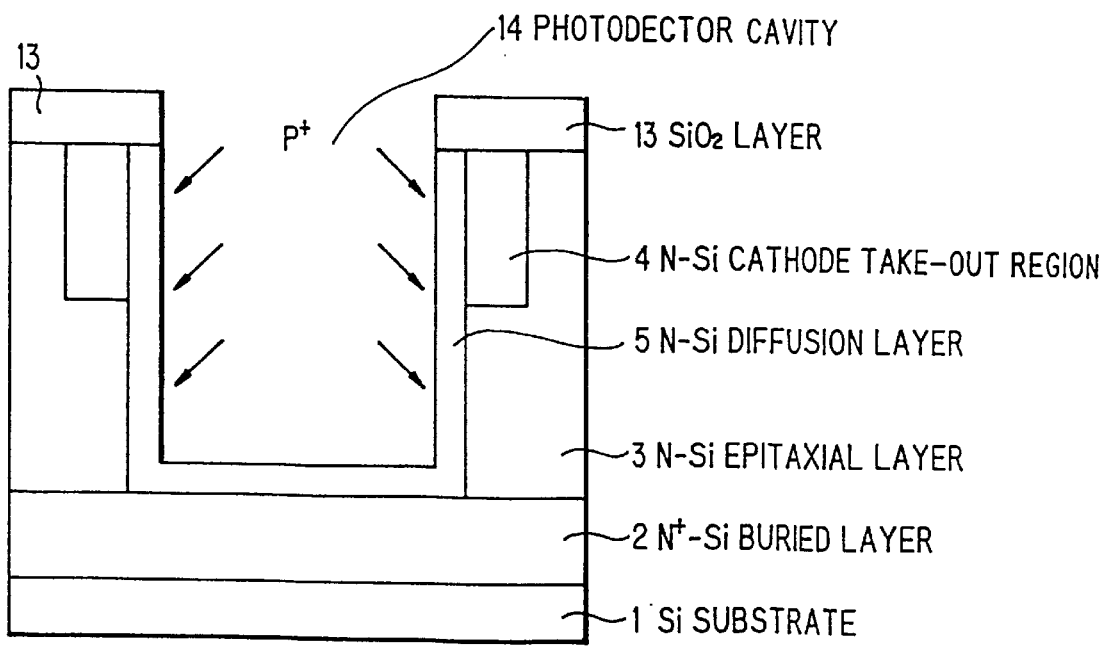

Next, as shown in FIG. 4B, the N-Si epitaxial layer 3 is etched using a $SiO_2$ layer 13 as a mask and a photodetector cavity 14 with the depth of 3 to 4 μm is formed. Then, P ions are obliquely implanted on the inner wall of the photodetector cavity 14 under the condition that, the angle of incidence is 45°, acceleration energy is 30 keV and dose-amount is $1 \times 10^{13}$ $cm^{-2}$ for example, and thermal treatment is carried out at 1000° C. for 30 minutes in the atmosphere on $N_2$ thereafter. Then, a N-Si diffusion layer 5 can be obtained. In this case, it is desirable that the N-Si diffusion layer 5 electrically contacts with the N-Si cathode take-out region 4 and the $N^+$-Si buried layer 2.

Figure 5A:
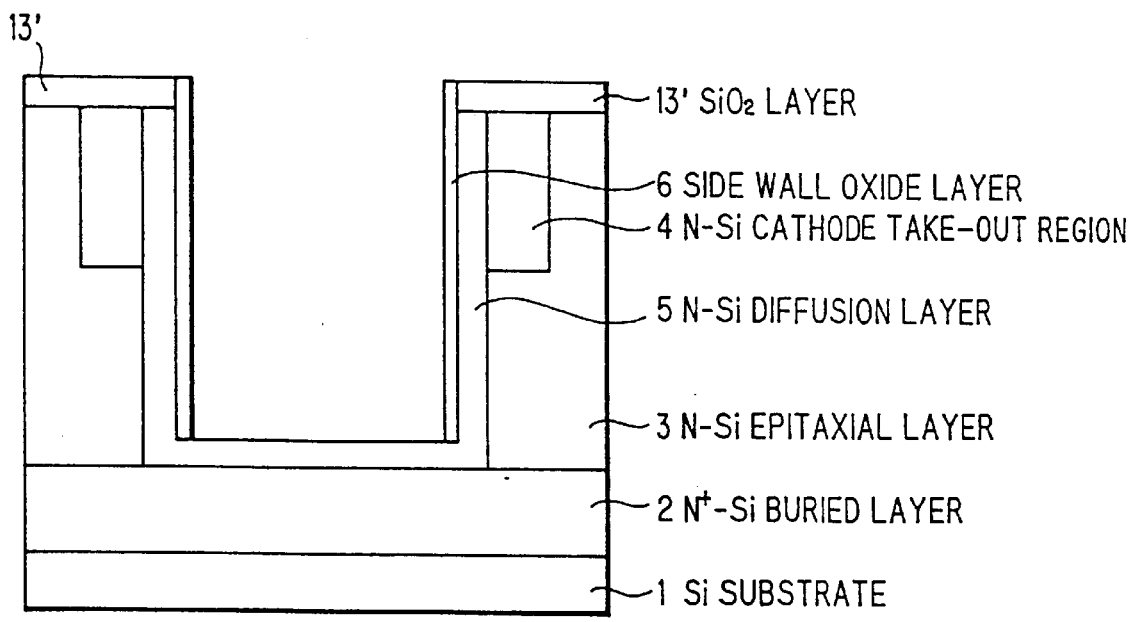
FIGS. 5A and 5B are respectively cross-sectional views for explaining a fabrication process of the photodetector shown in FIGS. 3A to 3B, continued from FIGS. 4A and 4B, FIGS. 6A and 6B are respectively cross-sectional views for explaining another fabrication process of the photodetector shown in FIGS. 3A and 3B, as the third preferred embodiment of the invention.
Figure 5B:
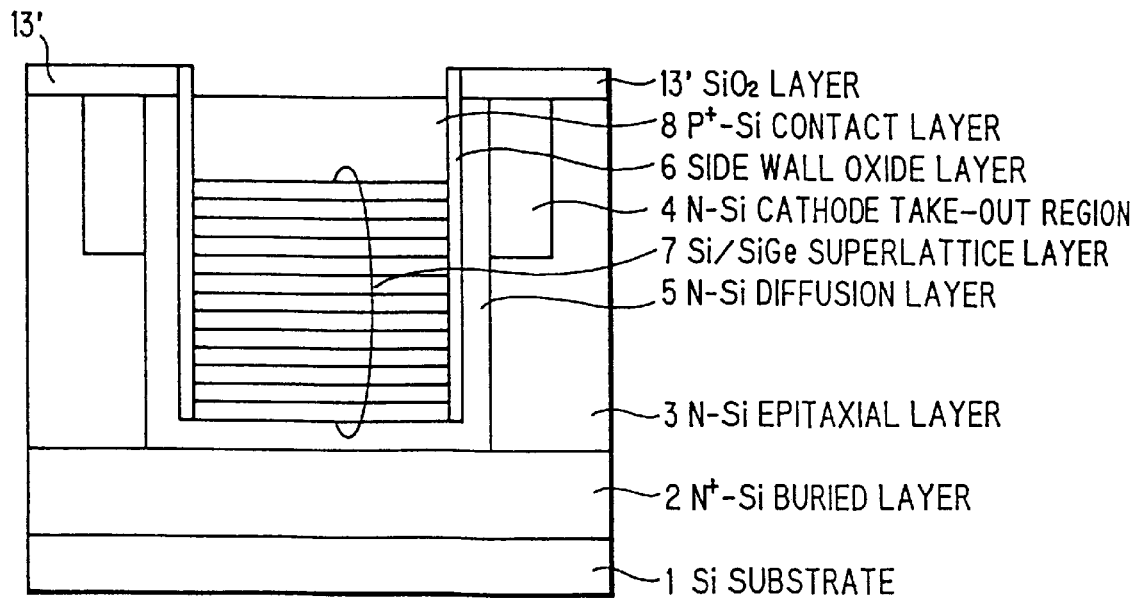

Next, a structure shown in FIG. 5A can be obtained by depositing a $SiO_2$ layer over the whole side surface of the photodetector cavity 14 and etching back the deposited layer to form a side wall oxide layer 6. Then, as shown in FIG. 5B, a Si/SiGe superlattice layer 7 and a $P^+$-Si contact layer 8 are successively grown on the N-Si diffusion layer 5 exposed on the bottom surface of the photodetector cavity 14 by selective epitaxial growth. Moreover, after growing a $SiO_2$ layer 13 on a top surface, holes are made therethrough on a region, under which cathode contacts 10 and anode contacts 11 are formed, and Al electrodes 12 are formed through the aforementioned holes. The photodetector can be fabricated by the aforementioned process.

Next, the operation of the photodiode will be explained in detail referring to the appended drawings. As mentioned in the above, the thickness of a light absorption layer must be increased in order to increase the photo-sensitivity of the photodiode. Accordingly, in the conventional photodiode, since a distance from the N-Si cathode take-out region 4 to the $N^+$-Si buried layer 2 increases as shown in FIG. 1B and the impurity concentration of the N-Si epitaxial layer 3 is low, the resistance of a cathode circuit increases in the conventional photodiode.

On the other hand, as shown in FIG. 3B, in the photodiode according to the invention, the Si/SiGe superlattice layer 7, which serves as the light absorption layer, is successively formed by selective epitaxial growth in the photodiode cavity formed in the N-Si epitaxial layer 3, which is grown on the Si substrate 1 via the $N^+$-Si buried layer 2, and the N-Si diffusion layer 5 is formed on the bottom and around the side wall of the photodetector cavity, and serves as a portion of a cathode take-out region. Since the N-Si diffusion layer 5 can be formed with higher impurity concentration than that of the N-Si epitaxial layer 3 and a current generated in the light absorption layer flows into the N-Si cathode take-out region 4 via the $N^+$-Si buried layer 2 and the N-Si diffusion layer 5, the resistance of a cathode circuit can be greatly decreased. Accordingly, the time constant of photodetection is decreased, and quick photoresponse of the photodiode can be achieved.

The process of fabrication of the photodiode according to the invention is greatly simplified as compared with that of the conventional photodetector shown in FIGS. 2A to 2B, because the N-Si epitaxial layer can be grown at a time according to the invention, while the two N-Si epitaxial layers must be successively grown in the conventional photodetector, and the intermediate $N^+$-Si diffusion layer 24 becomes unnecessary.

In the photodetector according to the invention, since the N-Si diffusion layer 5 can be formed in self-alignment without being concerned with the depth of the photodetector cavity, the depth of the light absorption layer can be selected at will and the degree of freedom in design can be increased.

Figure 6A:
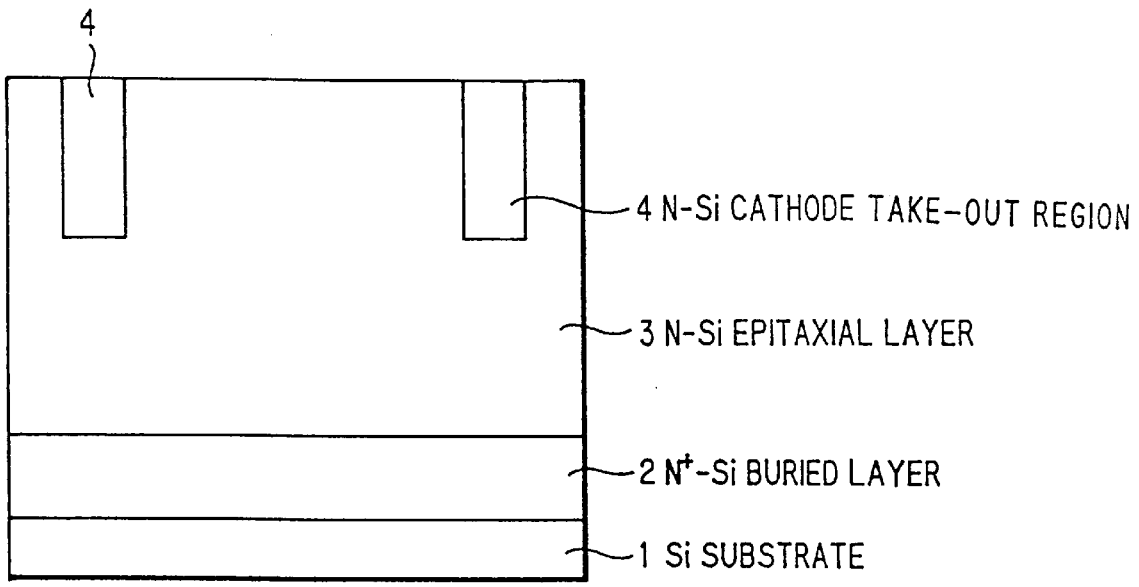

Next, the third preferred embodiment of the invention for fabricating the photodiode will be explained referring to the appended drawings. The difference between the second and third preferred embodiments lies in the method of fabrication of a photodetector. The planar and cross-sectional views of the photodetector fabricated by the method of the third preferred embodiment are respectively shown in FIGS. 3A and 3B. Next, the process of fabrication of this photodetector will be explained referring to the appended drawings. First, as shown in FIG. 6A, a $N^+$-Si buried layer 2 is formed on a Si substrate 2, and a N-Si epitaxial layer 3 is grown thereon, where the depth of this epitaxial layer is about 3 to 5 μm. Next, P ions are implanted using a photoresist (not shown) as a mask, a thermal treatment is carried out at 1000° C. for 30 minutes in the atmosphere of $N_2$ and a N-Si cathode take-out region 4 is formed.

Figure 6B:
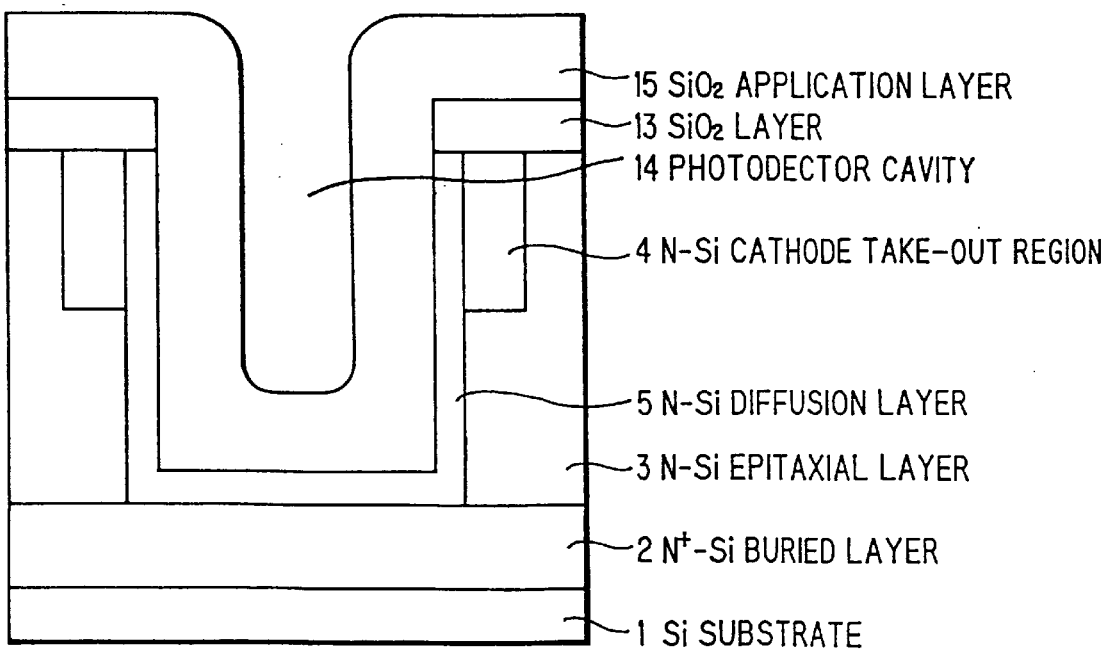

Subsequently, as shown in FIG. 6B, the N-Si epitaxial layer 3 is etched using a SiO$_2$ layer 13 as a mask, and a photodetector cavity 14 with a depth of 3 to 4 μm is formed. Then, after forming a SiO$_2$ application layer 15 containing As with high density over a whole surface, a thermal treatment is carried out at 1000° C. for 30 minutes in the atmosphere of N$_2$, and a N-Si diffusion layer 5 is formed. In the aforementioned process, it is desirable that the N-Si diffusion layer 5 is electrically connected with the N-Si cathode take-out region 4 and the N$^+$-Si buried layer 2.

Figure 7A:
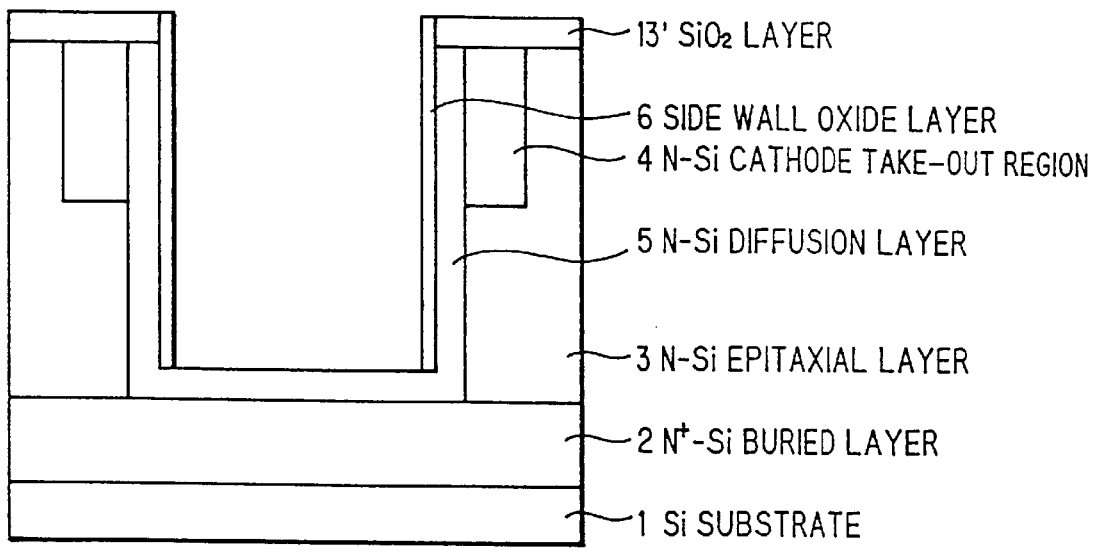
FIGS. 7A and 7B are respectively cross-sectional views for explaining another fabrication process of the photodetector shown in FIGS. 3A and 3B, continued from FIGS. 6A and 6B.
Figure 7B:
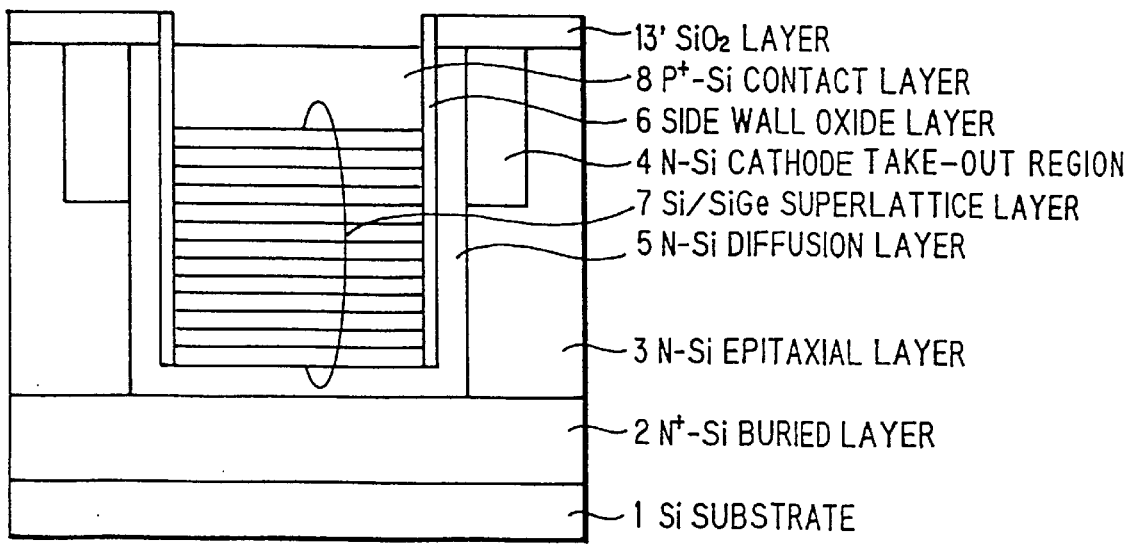

Next, after removing the SiO$_2$ application layer 15 and depositing a SiO$_2$ layer over the whole surface, a side wall oxide layer 6 is formed on the side wall of the photodetector cavity 14 by etching back, as shown in FIG. 7A. Next, as shown in FIG. 7B, a Si/SiGe superlattice layer 7 and a P$^+$-Si contact layer 8 are successively grown by selective epitaxial growth on the N-Si diffusion layer 5 exposed on the bottom of the photodetector cavity 14. Then, a SiO$_2$ layer 9 is grown on a top surface, and holes are made on a region, under which a cathode contacts 10 and an anode contacts 11 are formed, and Al electrodes 12 are formed thereon. By the aforementioned process, a photodetector shown in FIGS. 3A and 3B is fabricated.

In the third preferred embodiment, since the N-Si diffusion layer 5 is formed by diffusion of Si from the SiO$_2$ application layer 15, controllability of the process in the depth-direction is not so satisfactory. However, since there are few damages caused by ion implantation on the surface of the processed substrate, the undesirable influence on the selective epitaxial growth of the light absorption layer is small, which is a point of difference between the second and third preferred embodiments.

As mentioned in the above, the first advantage of the invention is that the resistance of the cathode circuit can be decreased and quick photoresponse can be achieved, even when the depth of the light absorption layer is increased in order to improve the photo-sensitivity. The reason is that the N-Si diffusion layer is provided on the bottom and around the side wall of the cavity for forming the photodetector, and thereby the current flows into the cathode through the N-Si diffusion layer with higher impurity concentration rather than through the N-Si epitaxial layer.

The second advantage is that the process can be simplified, because the intermediate layer to be inserted between the cathode take-out region and the buried layer becomes unnecessary. The reason is that the N-Si diffusion layer around the side wall of the photodetector cavity can be easily and continuously formed extending from the top surface of the processed substrate to the bottom of the photodetector cavity.

The third advantage is that, the resistance of the cathode circuit can be decreased and the degree of freedom in design is increased, even if the depth of the light absorption layer of the photodetector is selected at will. The reason is that the N-Si diffusion layer can be formed on the bottom and around the side wall of the photodetector cavity in self alignment, after the photodetector cavity is formed.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A photodetector comprising:

a planar epitaxial layer;

a cavity in said epitaxial layer that is surrounded by a side wall oxide layer;

laminations of a light absorption layer and a contact layer inside said cavity, said contact layer being a first conductivity type;

a first diffusion layer of a second conductivity type on a bottom of said cavity;

a second diffusion layer of the second conductivity type surrounding said side wall oxide layer and extending from a top surface of said epitaxial layer to said first diffusion layer, said first and second diffusion layers both having a resistance less than that of said epitaxial layer; and a take-out region of the second conductivity type with high impurity concentration that is electrically connected to said second diffusion layer.

2. A photodetector according to claim 1, wherein:

said photodetector comprises a buried layer of the second conductivity type directly under and in contact with said first diffusion layer and said epitaxial layer.

3. A photodetector according to claim 2, wherein:

said buried layer is on a semiconductor substrate.

4. A photodetector according to claim 3, wherein:

said semiconductor substrate is a silicon substrate.

5. A photodetector according to claim 2, wherein:

said first conductivity type is P type and said second conductivity type is N type.

6. A photodetector according to claim 2, wherein:

said first conductivity type is N type and said second conductivity type is P type.

7. A photodetector according to claim 1, wherein:

said light absorption layer is composed of a Si/SiGe superlattice layer.

8. A photodetector according to claim 1, wherein:

an impurity concentration of said first diffusion layer is larger than $10^{17}$ cm$^{-3}$.

9. A photodetector according to claim 1, wherein:

an impurity concentration of said second diffusion layer is larger than $10^{17}$ cm$^{-3}$.

10. The photodetector of claim 1, wherein said second diffusion layer has a generally uniform impurity concentration from the top surface of said epitaxial layer to said first diffusion layer.

11. The photodetector of claim 10, wherein the impurity concentration of said second diffusion layer is larger than $10^{17}$ cm$^{-3}$.

12. The photodetector of claim 11, wherein an impurity concentration of said first diffusion layer is larger than $10^{17}$ cm$^{-3}$.

13. In a photodetector having an epitaxial layer with a cavity therein, an oxide layer on a side wall of the cavity, a laminated light absorption layer in the cavity, a buried layer contacting the epitaxial layer beneath the cavity, and a cathode take-out region in the epitaxial layer spaced from the side wall of the cavity and from the buried layer, the improvement comprising a low resistance layer electrically connecting the cathode take-out region to the side wall of the cavity and to the buried layer, the low resistance layer having a lower resistance than that of the epitaxial layer.

14. A photodetector comprising:

a semiconductor substrate;

a cavity in said semiconductor substrate that is surrounded by a side wall oxide layer;

laminations of a light absorption layer and a contact layer inside said cavity, said contact layer being a first conductivity type;

a first diffusion layer of a second conductivity type on a bottom of said cavity;

a second diffusion layer of the second conductivity type surrounding said side wall oxide layer and extending from a top surface of said semiconductor substrate to said first diffusion layer, said first and second diffusion layers both having a resistance less than that of said semiconductor substrate; and a take-out region of the second conductivity type with high impurity concentration that is electrically connected to said second diffusion layer.

15. The photodetector of claim 14, wherein said second diffusion layer has a generally uniform impurity concentration from the top surface of said semiconductor substrate to said first diffusion layer.

* * * * *